United States Patent
Kim

(10) Patent No.: US 6,753,545 B2
(45) Date of Patent: Jun. 22, 2004

(54) LIGHT-EMITTING DEVICE WITH QUANTUM DOTS AND HOLES, AND ITS FABRICATING METHOD

(75) Inventor: Hoon Kim, Ulsan (KR)

(73) Assignee: NMCTek Co. Ltd., Seoul (KR)

( * ) Notice: Subject to any disclaimer, the term of this patent is extended or adjusted under 35 U.S.C. 154(b) by 0 days.

(21) Appl. No.: 10/211,564

(22) Filed: Aug. 5, 2002

(65) Prior Publication Data

US 2002/0190264 A1 Dec. 19, 2002

Related U.S. Application Data

(62) Division of application No. 09/798,062, filed on Mar. 2, 2001, now Pat. No. 6,544,808.

(30) Foreign Application Priority Data

Mar. 4, 2000 (KR) ........................ 2000-11402

(51) Int. Cl.[7] .................... H01L 29/06; H01L 33/00
(52) U.S. Cl. .................. 257/14; 257/9; 257/88; 257/89; 257/91; 257/99; 257/103
(58) Field of Search ................. 257/14, 9, 321, 257/88, 89, 91, 92, 95, 99, 103, 13, 17, 21

(56) References Cited

U.S. PATENT DOCUMENTS

| | | | |
|---|---|---|---|
| 5,354,707 A | * 10/1994 | Chapple-Sokol et al. | 438/24 |
| 5,710,436 A | 1/1998 | Tanamoto et al. | 257/14 |
| 5,812,574 A | * 9/1998 | Takeuchi et al. | 372/45 |
| 5,827,754 A | 10/1998 | Min et al. | 438/40 |
| 6,033,972 A | 3/2000 | Ro et al. | 438/507 |
| 6,291,132 B1 | 9/2001 | Glushko et al. | 430/270.15 |
| 6,329,668 B1 | 12/2001 | Razeghi | 257/14 |
| 2002/0162995 A1 | * 11/2002 | Petroff et al. | 257/21 |

OTHER PUBLICATIONS

Lachab et al., "Selective Fabrication of InGaN Nanostructures by the Focused Ion Beam/Metalorganic Chemical Vapor Deposition Process", *Journal of Applied Physics*, vol. 87, No. 3, Feb. 1, 2000, pp. 1374–1378.

Wang et al., "Metalorganic Chemical Vapor Deposition Selective Growth and Characterization of InGaN Quantum Dots", *Applied Physics Letters*, vol. 75, No. 7, Aug. 16, 1999, pp. 950–952.

* cited by examiner

*Primary Examiner*—Minhloan Tran
*Assistant Examiner*—Tan Tran
(74) *Attorney, Agent, or Firm*—Mintz Levin Cohn Ferris Glovksy & Popeo, P.C.

(57) ABSTRACT

A method is provided for forming quantum holes of nanometer levels. In an ion beam scanner, ions are projected from an ion gun onto a semiconductor substrate. During the projection, ions are focused into an ion beam whose focal point is controlled to determine the diameter of the ion beam, and the ion beam is accelerated. When being incident upon the semiconductor substrate, the ion beam is deflected so as to form a plurality of quantum holes. Also provided is a light-emitting device with quantum dots. Impurities are doped onto a semiconductor substrate to form a P-type semiconductor layer on which a undoped, intrinsic semiconductor is grown to a certain thickness. A plurality of quantum holes are provided for the intrinsic semiconductor layer, followed by filling materials smaller in energy band gap than the intrinsic semiconductor in annealed quantum holes through recrystallization growth. Next, an N-type semiconductor layer is overlaid on the quantum hole layer. Composition of the materials filled in the quantum holes determines the color of the light emitted from the light-emitting device. Thus, the semiconductor device is fabricated to emit light of the three primary colors or one of them. By cutting the semiconductor device, unit display panels or elements can be prepared which emit radiation at wavelengths corresponding to red, green and blue colors.

12 Claims, 17 Drawing Sheets

LIGHT-EMITTING DEVICE WITH QUANTUM DOTS AND HOLES, AND ITS FABRICATING METHOD

CROSS-REFERENCE TO RELATED APPLICATIONS

This application is a divisional of U.S. application Ser. No.: 09/798,062, filed Mar. 2, 2001, now U.S. Pat. No. 6,544,808 entitled "A Light-Emitting Device with Quantum Dots and Holes, and its Fabricating Method".

BACKGROUND OF THE INVENTION

1. Field of the Invention

The present invention relates to a method of forming a plurality of quantum holes of nanometer scale, a light-emitting device utilizing quantum dots, which is able to emit light of a predetermined color, and its fabricating method.

2. Description of the Prior Art

There are various lamps which convert electrical energy into electromagnetic radiation at visible wavelengths, that is, electric lamps such as incandescent lamps, halogen lamps, etc. Generally, such electric lamps can radiate monochromatic light only. Accordingly, they require various color filters and gels for the emission of light with various colors. However, such a radiation system as depends on many filters and gels for the expression of various colors of light has the significant drawback of a need to substitute filters or gels of new or different colors or exchange them with pre-existing ones whenever new or different colors are needed. Not only is the substitution or exchange inconvenient, but also it is impossible to express various colors precisely through color filters or gels.

Therefore, there was a need to develop new technology by which various colors of light can be expressed precisely and conveniently. Complying with such a need, light emitting diodes, which take advantage of semiconductors in emitting light of desired colors, have been developed and extensively used.

Representative of the light emitting diodes is a bulk-type light emitting diode, which comprises a PN junction layer between a P-type semiconductor and an N-type semiconductor, each of which has an electrode. When an electric field is applied across the electrodes, holes of the P-type semiconductor and the electrons of the N-type semiconductor move toward the PN junction layer and are combined with each other thereat, excited and transited, emitting the light corresponding to the energy difference.

In order to better understand the background of the invention, a conventional bulk type light emitting diode will be explained in conjunction with the accompanying drawings.

Referring to FIG. 1, there are shown structures of a conventional bulk type light emitting diode. As seen in FIG. 1, the conventional bulk type light emitting diode consists of a P-type semiconductor layer 12 and an N-type semiconductor layer 14 with a PN junction layer 16 therebetween. On the P-type semiconductor layer 12 consisting of GaN, INGaN is grown in crystal bulk to form the PN junction layer 16 atop which the N-type semiconductor layer 14 is then formed. Each of the P-type semiconductor layer 12 and the N-type semiconductor layer 14 may be composed of a plurality of layers.

The expression of a desired color of light is accomplished by a combination of three primary colors of light. In order to emit light of a desired color, thus, there are needed three bulk type light emitting diodes 10, 10a and 10b which can radiate at red, green and blue wavelengths, respectively.

The three light emitting diodes which radiate wavelengths corresponding to red, green and blue colors, respectively, differ from one another in the composition of the PN junction layer 16, particularly, the Indium(In) portion of the InGaN composition. That is, when PN junction layers are formed of single crystals of InGaN, they are grown with different Indium (In) compositions suitable for use in the emission of red, green and blue light, respectively. The reason why different Indium (In) compositions are used is that indium (In) is used to regulate the recombination energy between the carriers of electrons and holes.

Bulk type light emitting diodes 10, 10a and 10b, which emit light of three primary colors, are cut into individual light emitting diode elements of red 18, green 18a and blue 18b. Such light emitting diode elements are used individually or in a combined manner on a display panel.

With reference to FIG. 2, there is a structure of a display panel on which conventional bulk type light emitting diodes are employed, in combination, to express certain images. As seen in this figure, a plurality of the bulk type light emitting diodes 10, 10a and 10b are combined to form a display panel. For example, the display panel 20 is composed of 13 red light emitting diodes 10, 8 green light emitting diodes 10a, and 4 blue light emitting diodes 10b.

With reference to FIG. 3, there is a curve showing the light intensity versus wavelength in the display panel of FIG. 2. As recognized from the curve, the display panel 20 consisting of conventional bulk type light emitting diodes 10, 10a and 10b has a large distribution of wavelengths when the light intensity is weak. The large distribution of wavelengths is also found where the light intensity of the display panel is strong. That is, the wavelengths of the light emitted from the display panel 20 are distributed in a wide range even at the peak of the curve.

Accordingly, the display panel 20 consisting of a plurality of conventional bulk type light emitting diodes 10, 10a and 10b can expresses a color only vaguely, with a broad range of wavelengths around the wavelength pertinent to the color, but not correctly with the precisely pertinent wavelength. That is, the conventional display panel 20 generates radiation at a wide range of wavelengths of light to express a color, so that viewers can only recognize a color not identical, but similar to the intended color due to limitations of human vision. Consequently, it is impossible for the conventional display to display a color of light entirely at the wavelength intrinsic to the color.

Besides, because of its large size, such a conventional bulk type light emitting diode is difficult to apply to a small size display device which is capable of expressing various colors and delicate images.

SUMMARY OF THE INVENTION

It is, therefore, an object of the present invention to provide a method of forming quantum holes of nanometer scale on semiconductor substrates.

To form such quantum holes, an ion beam scanner is utilized in the present invention. In the ion beam scanner, ions are projected from an ion gun onto a semiconductor substrate. During the projection, ions are focused into an ion beam whose focal point is controlled to determine the diameter of the ion beam, and the ion beam is accelerated. When being incident upon the semiconductor substrate, the ion beam is deflected so as to form a plurality of quantum holes.

It is another object of the present invention to provide a light-emitting device with quantum dots, capable of expressing colors of light clearly.

It is a further object of the present invention to provide a method for fabricating such a light-emitting device.

The light-emitting device can be fabricated by growing an intrinsic semiconductor layer on a P-type semiconductor layer, forming a plurality of quantum holes on the grown intrinsic semiconductor layer, filling the quantum holes with a material smaller in energy band gap than the intrinsic semiconductor by single crystal growth, and overlaying an N-type semiconductor layer on the quantum hole layer.

Advantageously, the light-emitting devices can be cut into unit light emitting elements of micron sizes. Also, the semiconductor can selectively emit light of the three primary colors according to the materials by which single crystal are grown within the quantum holes. When being integrated, the unit light emitting elements can find various applications in the image display industry, such as illumination apparatuses, electric signs, and advertising panels.

In addition, the illumination using the light emitting elements of the present invention can be varied in color and intensity under digital control. Further, the light emitting elements of the present invention make image display free from size limitation. For instance, a matrix on which unit light emitting elements capable of emitting red, green and blue light separately are integrated can be applied to digital illumination in which predetermined colors are expressed under digital control. Therefore, the present invention can make a contribution to the development of illumination technology from the simplest level, e.g., simply brightening; to more complex levels, e.g., varying the color and intensity of light according to the rhythm and tone of music.

In association with digital technology, the light emitting elements of the present invention can express images very clearly and regulate colors precisely. In addition to generating neither heat nor infrared light, the light emitting elements of the present invention are almost semi-permanent. Since the three primary colors of light can be expressed clearly using only three unit light emitting elements, they can reduce sizes of displays, such as electric display panels, as well as enabling the displays to express clear images. Wavelengths of the light emitted from the semiconductor for use in a light emitting device of the present invention are distributed in a narrow range with the wavelength distribution curve having a sharp peak, so that complete images can be achieved on screens which use the semiconductor of the present invention.

Another feature of the present invention resides in the representation of bright images because the unit light emitting elements of the present invention are of micron sizes and can express pure colors and increase the intensity of the light emitted. In aspects of the intensity of light energy and the coherence of light wavelengths for a color, the unit light emitting elements of the present invention are closer to laser light emitting devices than to currently commercialized bulk type light emitting diodes. Further, the semiconductor allows the fabrication of a light emitting device which is able to emit radiation in a highly coherent range of wavelengths intrinsic to an intended color.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
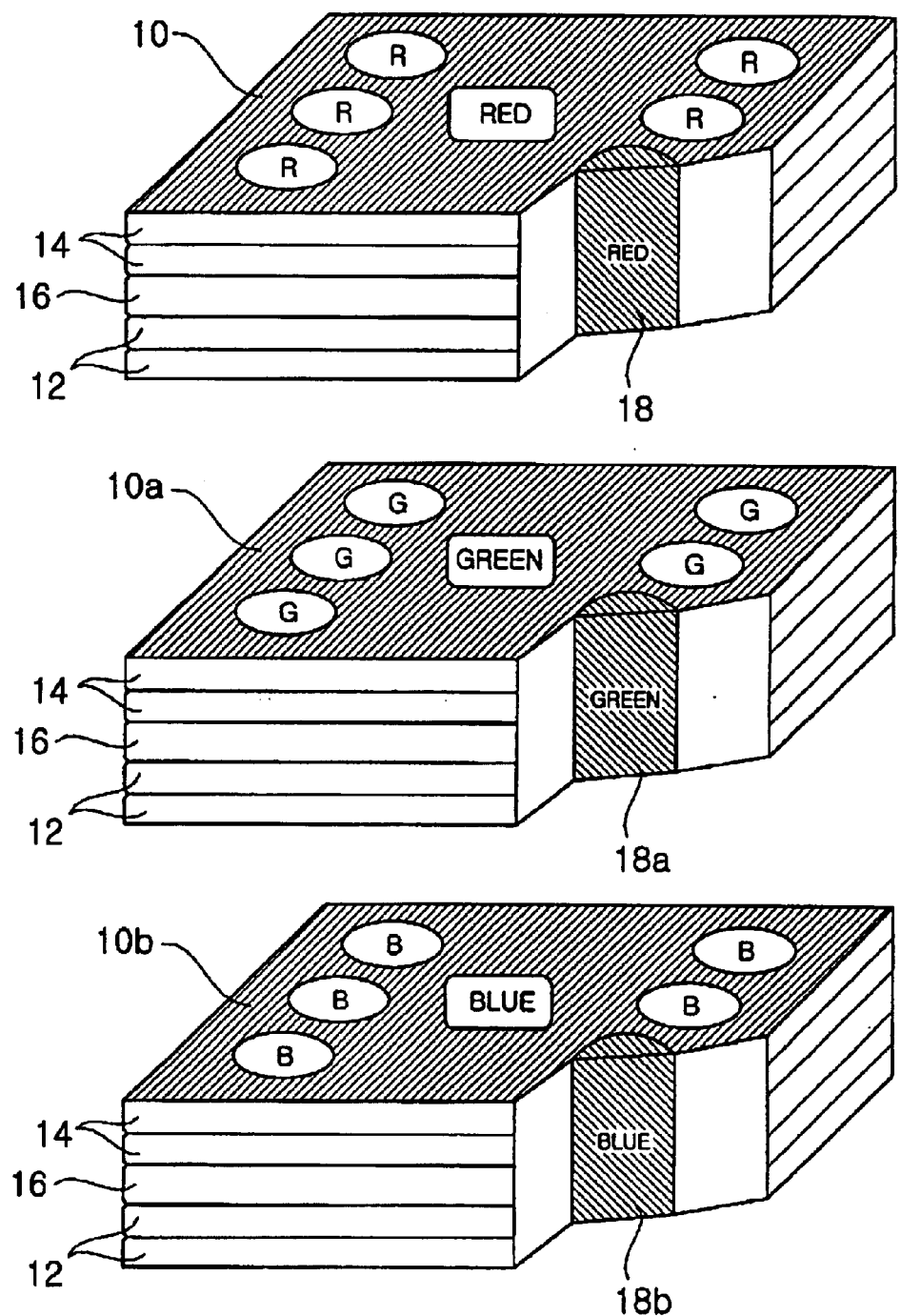
FIG. 1 shows views of structures of conventional bulk type light emitting diodes.
Figure 2:
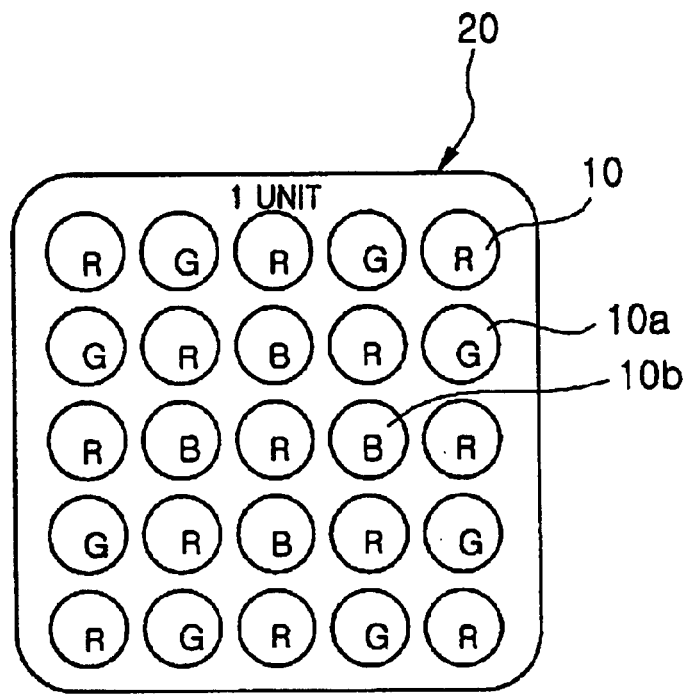
FIG. 2 is a schematic view showing a structure of a display panel employing conventional bulk type light emitting diodes.
Figure 3:
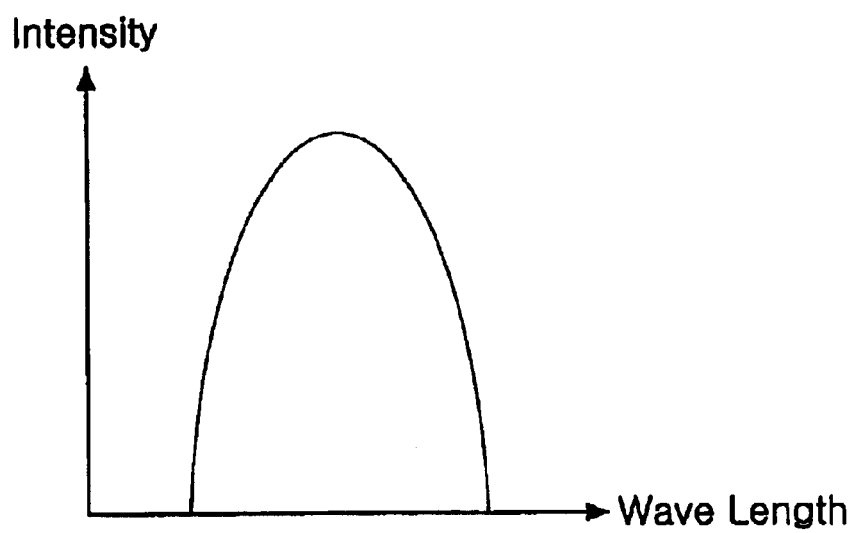
FIG. 3 is a curve showing the light intensity versus wavelength in the display panel of FIG. 2.

The application of the preferred embodiments of the present invention is best understood with reference to the accompanying drawings, wherein like reference numerals are used for like and corresponding parts, respectively. In the present invention, focused ion beams are employed to form a plurality of quantum holes with desired small sizes.

Figure 4:
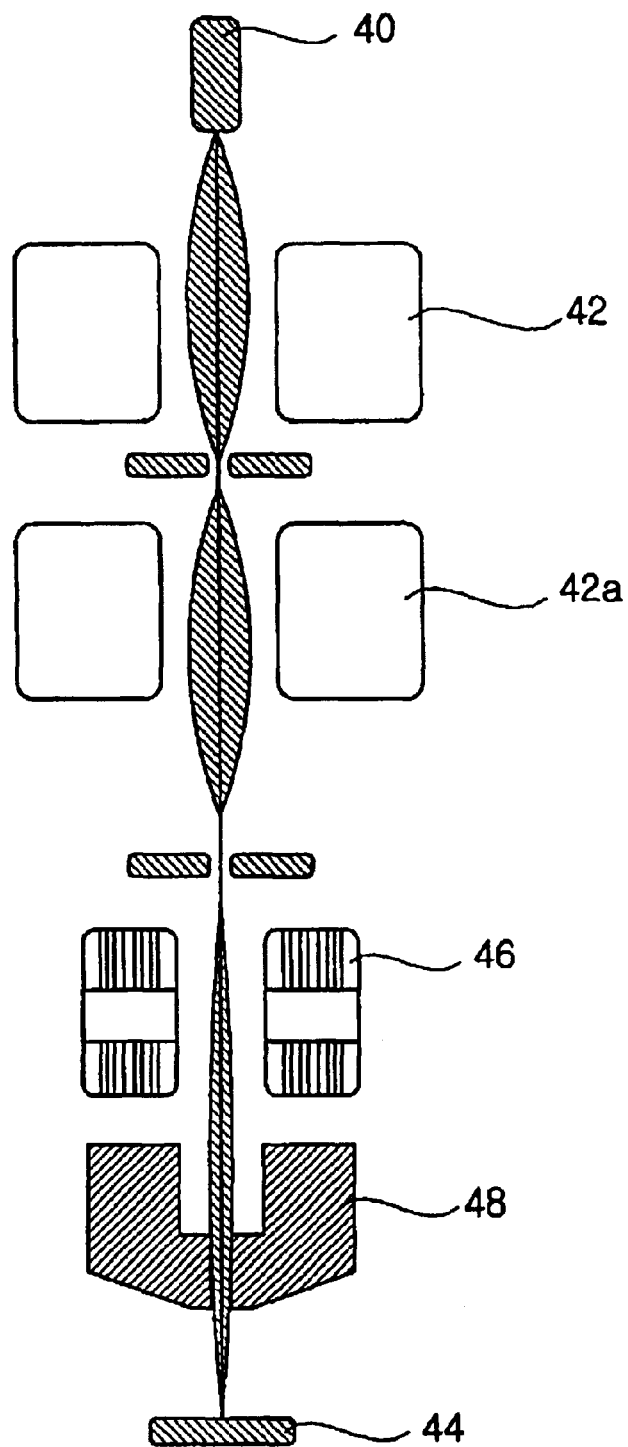
FIG. 4 a schematic view showing an ion beam scanner used for forming quantum holes of nanometer levels on semiconductor substrates.

Referring to FIG. 4, there is schematically shown an ion beam scanner suitable for use in the formation of a plurality of quantum holes with desired diameters and depths at very minute space intervals by focused ion beams. In this figure, an ion gun which projects ions at high speeds is denoted by reference numeral 40.

In front of the ion gun 40 is arranged condenser lenses 42 and 42a. A predetermined size of a slit is provided for these lenses 42 and 42a which generate an electric field and a magnetic field according to the voltage applied thereto. Ions emitted from the ion gun 40 are focused to form an ion beam during their passage through the condenser lenses 42 and 42a and the ion beam is incident on a substrate 44 situated at a site in front of the scanner 40. Means 46 and 48 for deflecting the ion beam up and down, right and left are disposed around the path through which the ion beam passes, between the condenser lens 42a and the substrate 44. The traveling velocity of the ion beam can be controlled by adjusting the acceleration voltage applied to acceleration means (not shown).

Once the substrate is impacted at predetermined spots by the ion beam from the ion beam scanner, the atomic structure on the surface of the substrate is destroyed and disrupted at the spots to form quantum holes.

In order to form quantum holes with desired diameters and depths, quantitative analysis is required to be made of the ion beam. It is difficult to achieve the formation of desirable quantum holes without accurate control of the magnitude and application time of the voltage, and the incidence time and intensity of the ion beam.

For instance, when the acceleration voltage is too low to sufficiently accelerate the ion beam, its forward progression is so weak that it cannot reach the surface 44 or separate the outermost atoms of the substrate 44, resulting in the formation of no quantum holes. On the other hand, at an acceleration voltage higher than a desired value, the incident ions are too fast and thus implanted into the substrate 44. Accordingly, it is necessary to accelerate the ion beam at proper acceleration voltages to form quantum holes with desirable diameters and depths.

As for the incidence time period of the ion beam, its control is also important in the formation of suitable quantum holes. For example, if the ion beam is incident for too long a period of time on the predetermined spots of the substrate, too large quantum holes result. Therefore, precise control must be imposed on the voltage at which the ion beam is accelerated, the focal points of the condenser lenses 42 and 42a, at which ions are focused, and the period of time for which the ion beam is incident on predetermined spots of the surface in order to achieve the formation of quantum holes with suitable diameters.

As explained above, various conditions for the ion beam scanner must be satisfied in forming quantum holes with desired diameters and depths.

In one embodiment of the present invention, an ion beam with a diameter of 100 nm is incident on an area of 1 mm×1 mm in an amount of 1×1016 CM-2 at an acceleration voltage of 25–35 kV for 5 sec or shorter to form a plurality of fine quantum holes on the substrate 44. In regard to the diameter of the ion beam, it can be diversely changed under the control of the focal points of the condenser lenses 42 and 42a.

Herein, it should be understood that the values suggested above are illustrative only, and not intended to limit the scope of the present invention. Changes in each condition are indispensably made according to the dimensions of quantum holes and other requirements and thus, the present invention is not limited thereto.

Figure 5A:
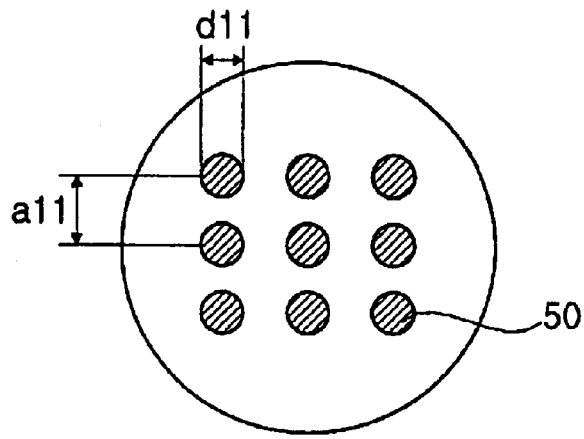
FIGS. 5a to 5c are schematic views illustrating that the diameters of quantum holes are controlled by varying the incidence time period of an ion beam incident on predetermined positions of the surface of a semiconductor substrate.
Figure 5B:
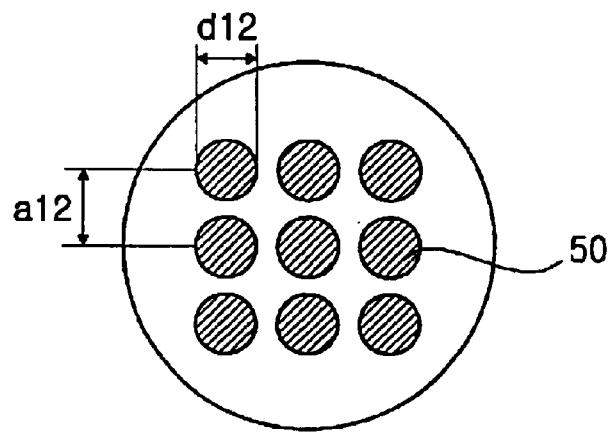
Figure 5C:
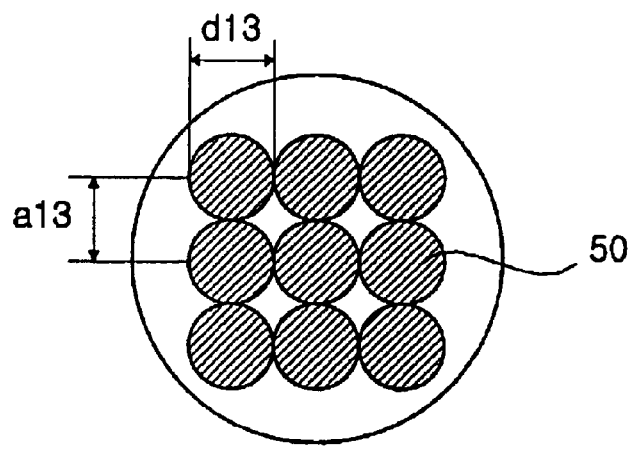

Turning now to FIGS. 5a to 5c, there are quantum holes whose diameters are varied with the incidence time period of the ion beam. When an ion beam is moved at regular space intervals (a11=a12=a13) to spots at which to form quantum holes on substrates of the same size, quantum holes 50 are formed with different sizes depending on the incidence time period of the ion beam.

For instance, when the ion beam is incident for a short period of time, as seen in FIG. 5a, the resulting quantum holes 50 are approximately 100 nm in diameter d11. The diameter can be increased to approximately 500 nm and 1 $\mu$m as the incidence time period of the ion beam is increased, as shown in FIGS. 5b and 5c. That is, the diameter of the quantum hole 50 increases with the incidence time period of the ion beam.

Figure 6:
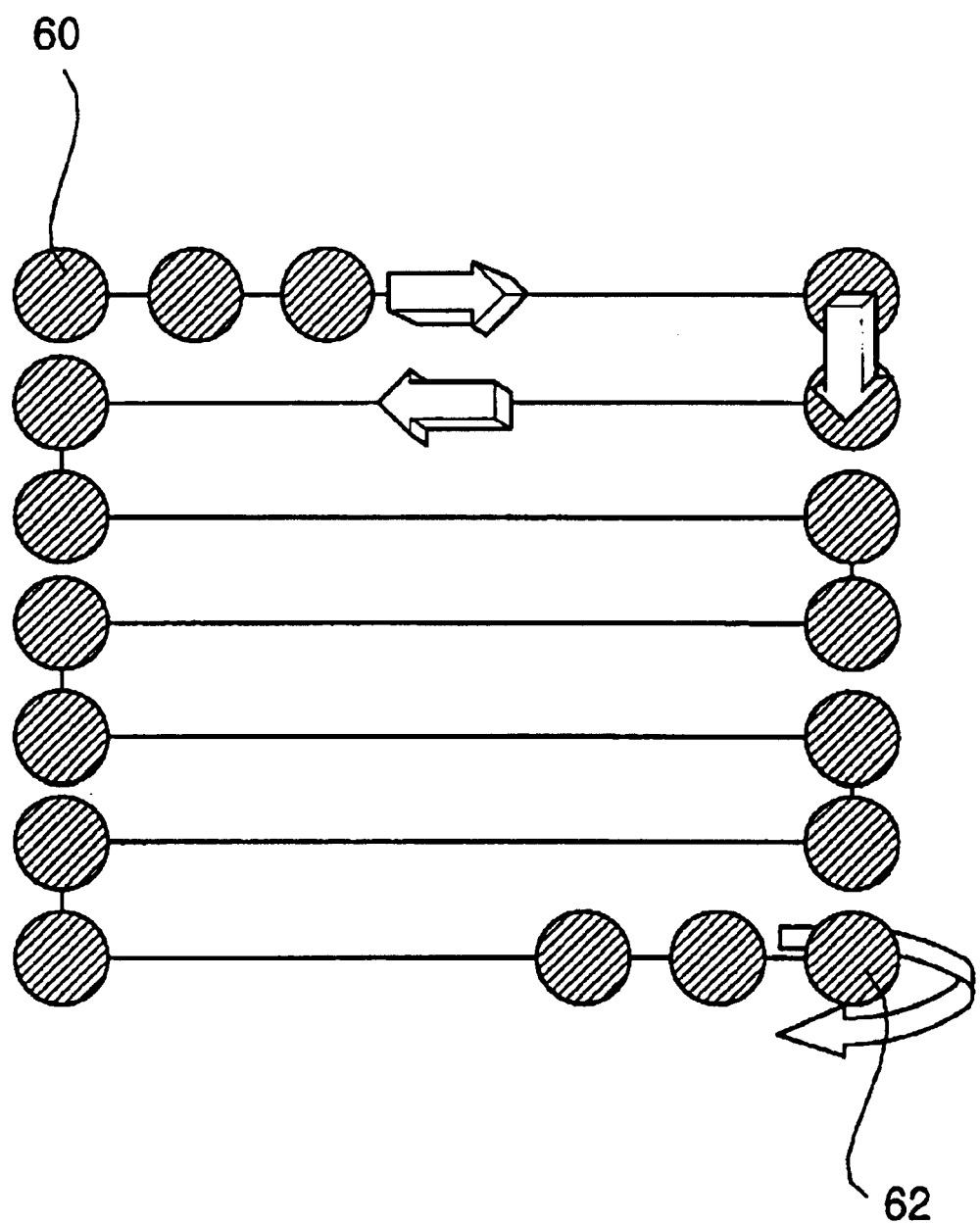
FIG. 6 is a view showing a travel trace of the ion beam, according to which quantum holes are formed on the substrate.

With reference to FIG. 6, there is shown a travel trace of the ion beam, according to which quantum holes are formed on the substrate. In an embodiment of the present invention, the ion beam is moved from a first position 60, that is, a left uppermost position, to a last position 62, that is, a right lowermost position in a zigzag manner.

When being moved to a position at which to form a quantum hole, the ion beam stays for the predetermined period of time, for example, about 1–5 ms. After the predetermined period of time, the ion beam is moved to the next position and stays to form a quantum hole thereat. This transposition of the ion beam is repeated to the last position 62.

After completion of irradiation of the ion beam to the last position 62, the ion beam is returned to the first position 60 and moved again according to the travel trace so that the ion beam is repeatedly incident on the same positions, that is, positions at which quantum holes are formed.

At this time, the focal points of the condenser lenses are controlled to set the diameter of the ion beam at a size of nanometers to hundreds of nanometers. Accordingly, while being controlled in diameter by use of the condenser lenses, the incident ion beam is accelerated at an acceleration voltage and moved from position to position under the influence of a magnetic field as if it scans an ultra thin film, giving impacts to the substrate. As a result, spot-like quantum holes with the same size as the ion beam's diameter are formed regularly on the substrate along the trace which the ion beam has traveled.

Under high vacuum, the incidence of the ion beam can result in the formation of millions of quantum holes within a short period of time. For instance, about 4 millions of quantum holes can be formed at a depth of 100 nm in an area of 1 mm×1 mm on a thin semiconductor substrate within several tens of minutes.

Of course, the depth of the formed quantum holes varies depending on the type of the substrate and the acceleration voltage used. The diameter of the quantum holes is determined by the diameter of the ion beam, which is controlled by the focal points of the condenser lenses, and the incidence time period of the ion beam.

In accordance with the present invention, quantum holes can be formed at desired sizes, depths and spacings, as described above, by controlling the acceleration voltage, the incidence time period, and the focal point. Using the focused ion beam, numerous quantum holes can be successfully formed on a substrate within a short period of time.

Figure 7:
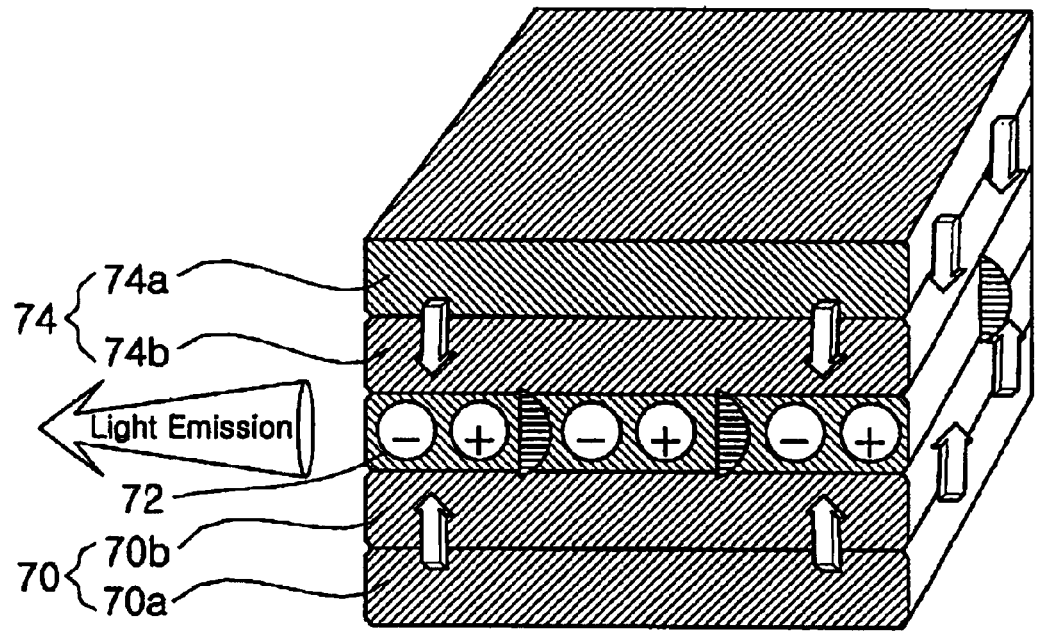
FIG. 7 is a view showing a laminar structure of the light-emitting device, in accordance with an embodiment of the present invention.

With reference to FIG. 7, there is illustrated a laminar structure of a light-emitting device, which takes advantage of the quantum holes of the present invention. As seen in FIG. 7, the laminar structure is composed of a P-type semiconductor layer 70 and an N-type semiconductor layer 74 with a quantum hole layer 72 therebetween. In order to fabricate the laminar structure, first, impurities are doped to a semiconductor substrate to form the P-type semiconductor layer 70 on which undoped, intrinsic semiconductor is in turn grown to a certain thickness to afford an intrinsic semiconductor layer.

Using the ion beam scanner which operates in the same manner as described above, numerous, very minute quantum holes are formed on the intrinsic semiconductor layer. The quantum holes on the quantum hole layer 72 are clarified by rapid thermal annealing at 800–1,000° C. for 10 sec.

Next, a material which is smaller in band gap than the intrinsic semiconductor of the quantum hole layer 72 is grown in a recrystallization manner within each of the quantum holes. Further, a material which is smaller in band gap than the intrinsic semiconductor of the quantum hole layer 72, is filled in the quantum holes to form a plurality of quantum dots. When the quantum dots are formed, materials lying over all surfaces except the quantum holes, are moved into the quantum holes through thermal diffusion.

After the quantum dot layer 72 is converted from the quantum hole layer 72, an intrinsic semiconductor is grown to a certain thickness on the quantum dot layer 72, followed by growing an impurity-doped, N-type semiconductor layer 74 on the intrinsic semiconductor layer thus formed.

Afterwards, the P-type semiconductor layer 70 and the N-type semiconductor layer 74 are separately provided with an electrode. Application of an electric field across the electrodes formed in the P-type and the N-type semiconductor layers 70 and 74 causes the holes of the P-type semiconductor layer 70 and the electrons of the N-type semiconductor layer 74 to move toward the quantum hole layer 72. The carriers of holes and electrons moved to the quantum hole layer 72, that is, the quantum dot layer 72 are concentratively recombined thereat, emitting light with a high energy. Because this light has an intrinsic wavelength, the light emitting device formed according to the present invention can produce radiation at an intrinsic wavelength, expressing a predetermined characteristic color.

Therefore, light-emitting devices can be fabricated, which emit light at wavelengths corresponding to the three primary colors, that is, red, green and blue, according to the present invention.

As seen in FIG. 7, the P-type semiconductor layer 70 may be formed into a plurality of hole supply layers 70a and 70b. Also, the N-type semiconductor layer 74 may be composed of a plurality of electron supply layers 74a and 74b.

To give unit light-emitting devices, the semiconductor laminar structure consisting of the P-type semiconductor layer 70, the quantum hole layer 72 which comprises a plurality of quantum holes filled with a material smaller in band gap than the base material through recrystallization growth, and the N-type semiconductor layer 74, is cut into suitable sizes. In this case, because not only the semiconductor laminar structure, but also the cut pieces can serve as light-emitting devices, the present invention will be explained without clear discrimination therebetween, below.

Figure 8:
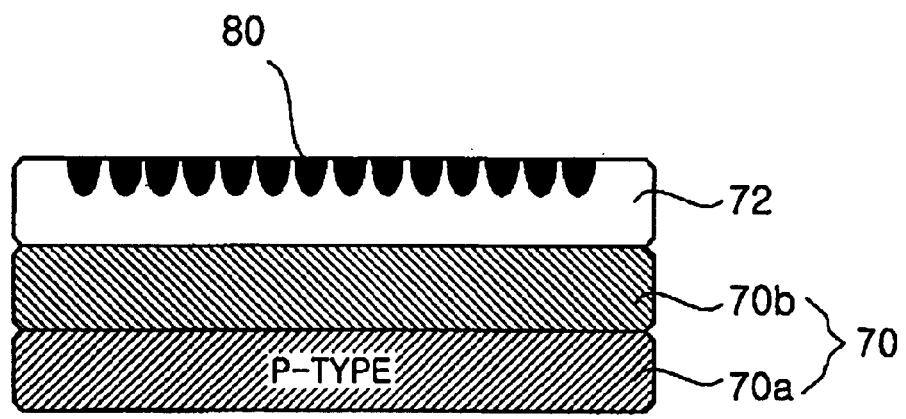
FIG. 8 is a schematic view showing a quantum dot layer of the light-emitting device, in accordance with an embodiment of the present invention.

Referring to FIG. 8, there is illustrated the quantum dot layer employed in the light-emitting device of the present invention. As described previously, an intrinsic semiconductor is grown to a certain thickness and numerous quantum holes are formed on the intrinsic semiconductor layer by use of the ion beam scanner. In the quantum hole layer 72 thus formed, a material different in band gap from the intrinsic semiconductor is filled through re-crystallization growth to give quantum dots 80. That is, the quantum dots 80 means the quantum holes in which materials with different energy band gaps are filled.

Figure 9:
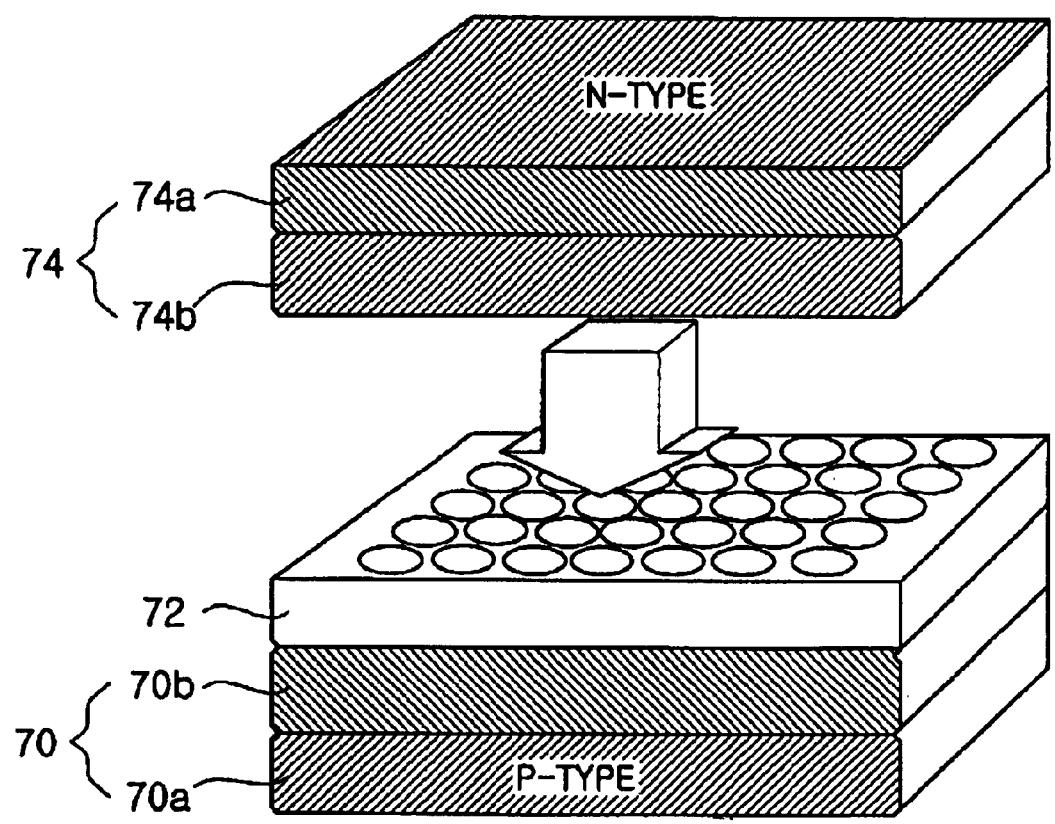
FIG. 9 is a view showing a structure of the light-emitting device, in accordance with an embodiment of the present invention.

In conjunction with FIG. 9, an embodiment of a light-emitting device is illustrated. On a GaN-doped P-type semiconductor layer 70, as seen in FIG. 9, is grown an intrinsic semiconductor layer in which a plurality of quantum holes are then formed, followed by the single crystal growth of InGaN within the quantum holes. Atop the resulting quantum hole layer 72, that is, the quantum dot layer, a GaN-doped N-type semiconductor layer 74 is formed.

Herein, GaAs and InAs may be used instead of GaN and InGaN, respectively. Of course, other alternatives may be found. In this embodiment, when the P-type semiconductor layer 70 and the N-type semiconductor layer 74 are connected to respective electrodes and electrically conducted, the quantum dots in the quantum hole layer 72 emit light at intrinsic wavelengths corresponding to their colors.

Figure 10:
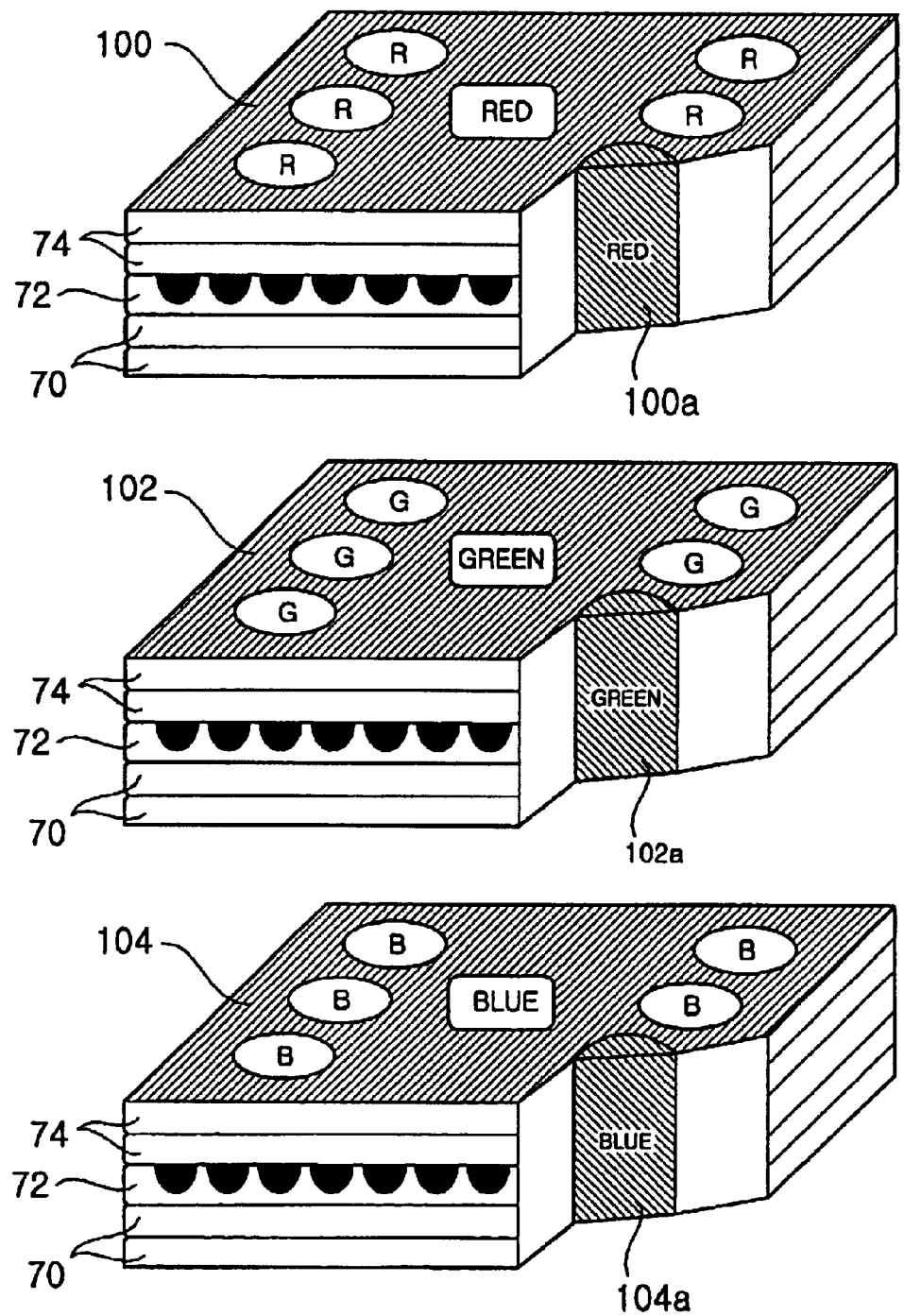
FIG. 10 shows views of structures of the light-emitting device, in accordance with an embodiment of the present invention.
Figure 11:
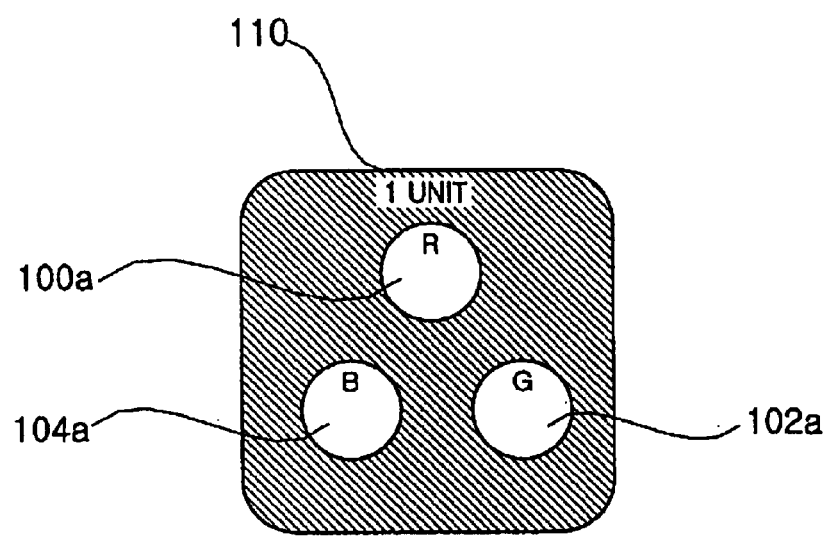
FIG. 11 is a schematic view showing a display panel which employs the semiconductors of FIG. 10 to express images.
Figure 12:
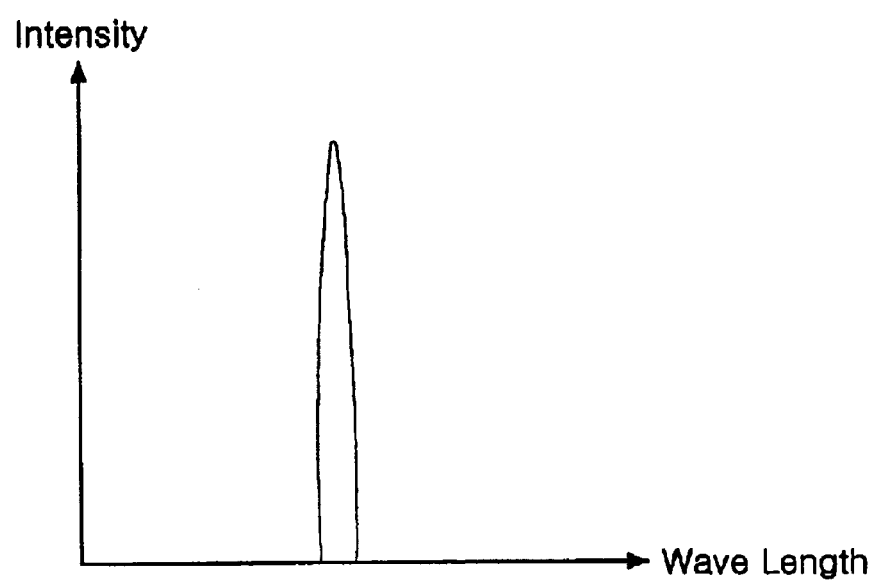
FIG. 12 is a curve showing the light intensity versus wavelength in the display panel of FIG. 11.

Turning now to FIGS. 10 to 12, there are illustrated the structure and characteristics of a light-emitting device, in accordance with the present invention.

FIG. 10 is a schematic diagram showing structures of light-emitting semiconductors devices, in accordance with another embodiment of the present invention. As seen in this diagram, a quantum hole layer 72 and an N-type semiconductor layer 74 are sequentially formed over a P-type semiconductor layer 70 consisting of GaN. The quantum hole layer 72 is based on an intrinsic semiconductor layer in which there are formed a plurality of quantum holes which are filled with InGaN through single crystal growth. In the diagram, quantum holes are depicted exaggeratedly for convenience, but are in fact small enough to be expressed in nanometer unit.

There are three light-emitting devices 100, 102 and 104, which are responsible for the three primary colors, red, green and blue, respectively. Which color of the three primary colors is selected for a light-emitting device is determined by the indium (In) composition of the quantum hole layer 72. That is, the indium (In) compositions of the quantum hole layer 72 determine the characteristic colors of the light-emitting devices. In this regard, when InGaN is filled within the quantum holes by single crystal growth, the composition of indium (In) may be controlled to select a color from the three primary colors.

The light-emitting device, fabricated according to the present invention, is cut into unit elements of suitable sizes, that is, unit red light emitting elements 100a, unit green light emitting elements 102 and unit blue light emitting elements 104a.

Referring to FIG. 11, there is a unit display panel 110 for displaying images using the light-emitting device of the present invention. Consisting of a combination of a unit red light emitting element 100a, a unit green light emitting element 102a and a unit red light emitting element 104a as seen in this figure, the unit display panel 110 can express desired colors of an image clearly.

FIG. 12 is a curve showing the light intensity versus wavelength in the display panel of FIG. 11. As apparent from the curve, wavelengths of the light emitted from the light-emitting device of the present invention are distributed in a narrow range with the wavelength distribution curve having a sharp peak. Therefore, the display panel 110 employing the light-emitting devices can emit radiation in a narrow range of wavelengths, thereby expressing desired colors clearly.

Figure 13A:
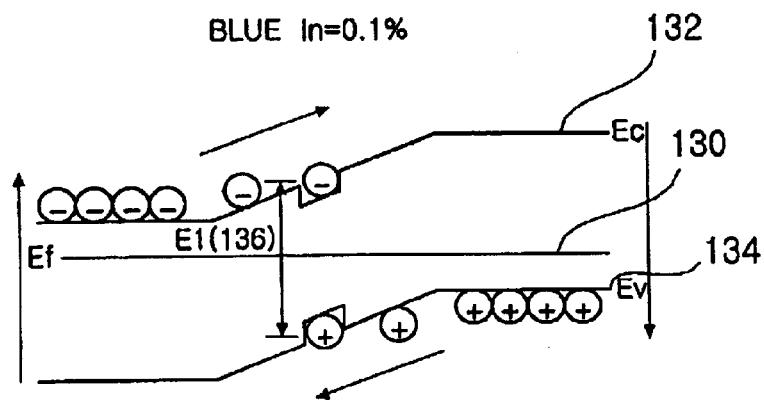
FIG. 13 shows band diagrams of energy band gaps according to colors.

With reference to FIG. 13, there are band diagrams showing energy band gaps according to colors. In FIG. 13*a*, there is an energy band gap between the electrons and holes when indium (In) is used at an amount of 0.1% for the expression of blue. On the basis of the middle straight light 130 which shows an Ef (Fermi energy), an Ec (conduction band) 132 for electrons is expressed by the upper line and an Ev (valence band) 134 for holes by the lower line. E1 136 is the energy with which light is emitted at a blue wavelength from the light-emitting device when indium (In) is used at an amount of 0.1%.

Figure 13B:
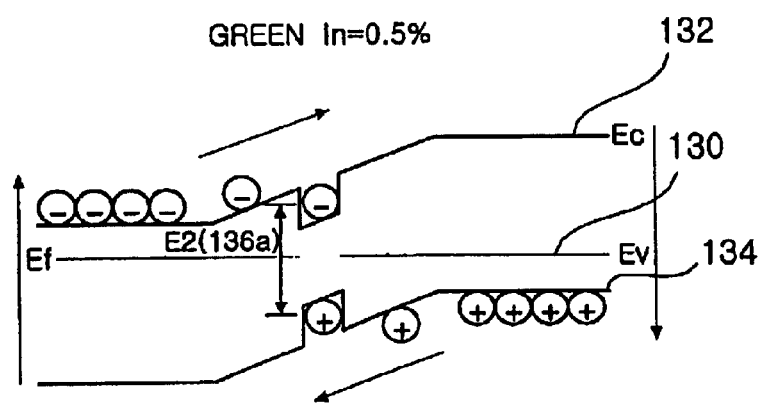

FIG. 13*b* shows an energy band gap between the electrons and holes when indium (In) is used at an amount of 0.5% for the expression of green. Light is emitted with an energy as large as E2 136*a* from the light-emitting device which employs indium (In) at an amount of 0.5%, expressing a green color.

Figure 13C:
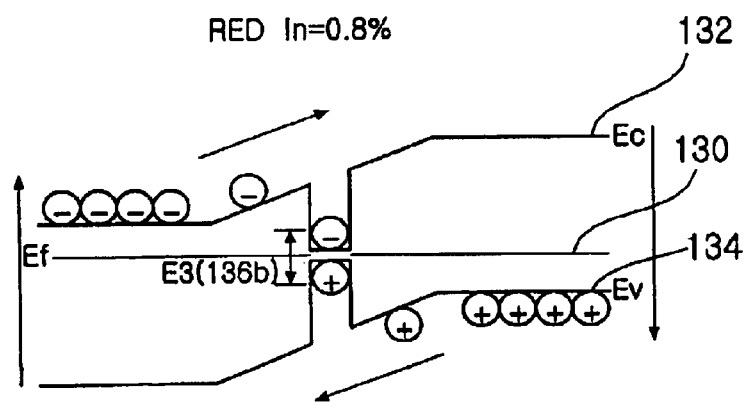

FIG. 13*c* shows an energy band gap between the electrons and holes when indium (In) is used at an amount of 0.8% for the expression of red. Light is emitted with an energy as large as E3 136*b* from the light-emitting device which employs indium (In) at an amount of 0.8%, expressing a red color.

As seen in FIG. 13, blue, green and red light is the order of energy in descending power. In connection with FIGS. 14 to 16, a light-emitting device is illustrated which takes advantage of the quantum holes, according to another embodiment of the present invention.

Figure 14:
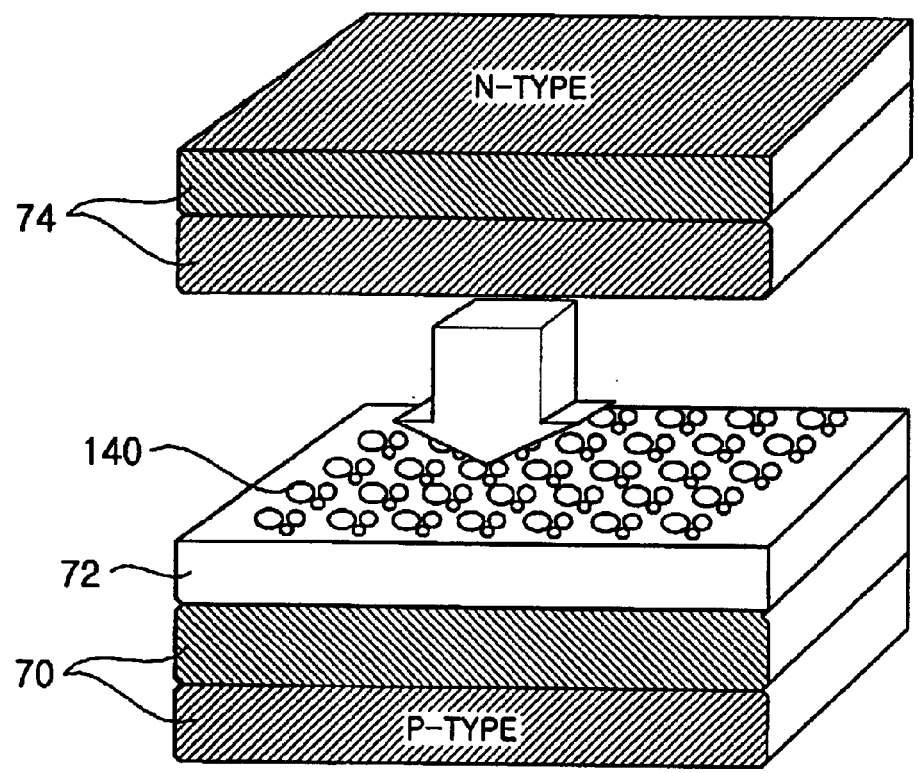
FIG. 14 is a view showing a structure of a light-emitting device, in which the three primary colors of light are radiated simultaneously from a quantum hole layer, in accordance with another embodiment of the present invention.

FIG. 14 shows a structure of a light-emitting device, in which the three primary colors of light are radiated simultaneously from a quantum hole layer, in accordance with another embodiment of the present invention. The light-emitting device, as shown in the figure, comprises a P-type semiconductor layer 70 and an N-type semiconductor layer 74 with a quantum hole layer 72 being disposed therebetween. On the quantum hole layer 72, sets of three quantum holes 140, which are different from one another in size, are arranged in a regular pattern. In the quantum holes 140 of the quantum hole layer 72, materials which are different in energy band gap according to the size are filled by crystal growth. Through the filling process, all the quantum holes 140 in the quantum hole layer 72 are converted into quantum dots which contain materials different in energy band gap according to their size. The quantum dots are cut in such a way that three different quantum holes 140 are combined together to form a light emitting unit which can be used as a light emitting device.

Figure 15:
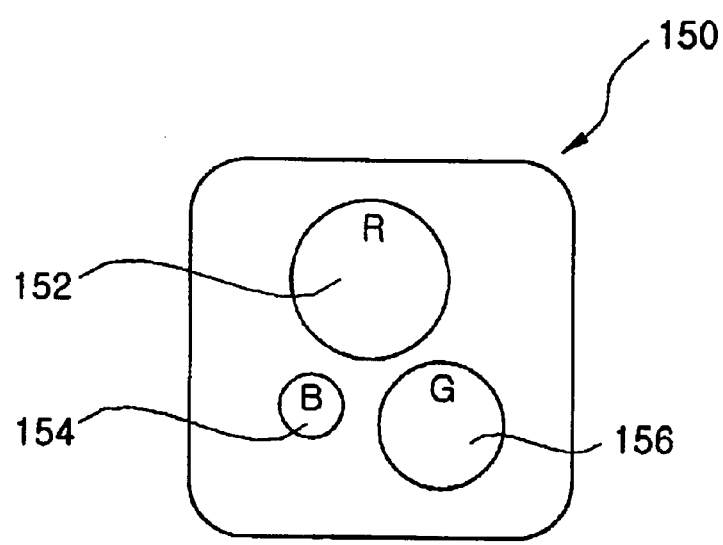
FIG. 15 is a schematic view showing a light emitting unit cut from the light-emitting device of FIG. 14.

With reference to FIG. 15, there is shown a light emitting unit 150 consisting of three light emitting elements which are different in quantum hole size from each other. In one version of this embodiment, the light emitting unit 150 is provided with a red light emitting element, a blue light emitting element and a green light emitting element whose quantum holes are the largest, the smallest and the middle in size, respectively. Since the blue light is the highest in energy, its light emitting element is based on the smallest quantum hole. On the other hand, the light emitting element responsible for the radiation of red light employs the largest quantum hole owing to the lowest energy of red light. For a similar reason, the light emitting element responsible for the radiation of green light occupies the middle quantum hole.

Figure 16:
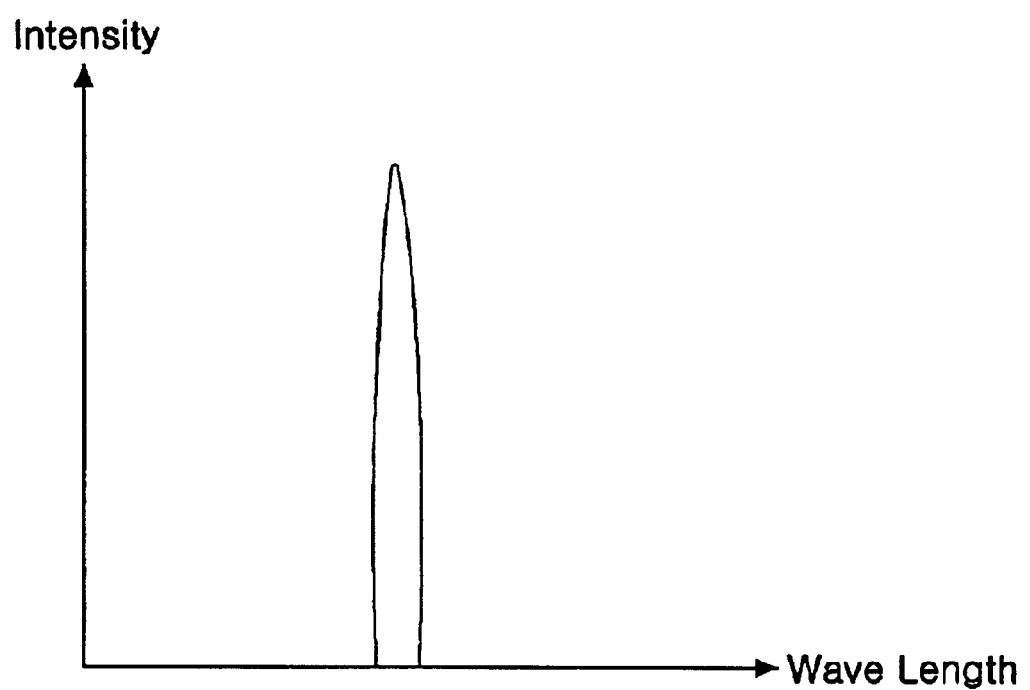
FIG. 16 is a curve showing the light intensity versus wavelength in the light emitting unit of FIG. 15.

With reference to FIG. 16, there is a curve showing the light intensity versus wavelength in the light emitting unit of FIG. 15. As apparent from the curve, wavelengths of the light emitted from the light emitting unit in accordance with another embodiment of the present invention are distributed in a narrow range with the wavelength distribution curve having a sharp peak. Therefore, the light emitting unit can provide radiation at a narrow range of wavelengths, thereby expressing desired colors clearly.

With reference to FIG. 17, there are band diagrams showing energy band gaps and quantum hole sizes according to light colors. In FIG. 17, the upper line over the middle straight line for a Fermi energy Ef 170 expresses an Ec (conduction band) 172 for electrons while the lower line is responsible for an Ev (valence band) 174 for holes.

Figure 17A:
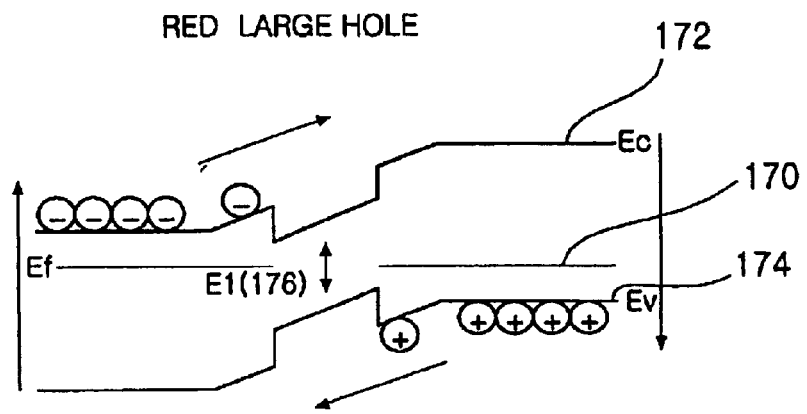
FIGS. 17a to 17c are band diagrams showing the relation of energy band gaps and light colors when quantum holes are formed at different sizes in accordance with a further embodiment of the present invention.

FIG. 17*a* shows the magnitude of the energy of the light emitted when the largest quantum hole is employed. E1 176 is the energy with which light is emitted at a red wavelength from the light emitting element.

Figure 17B:
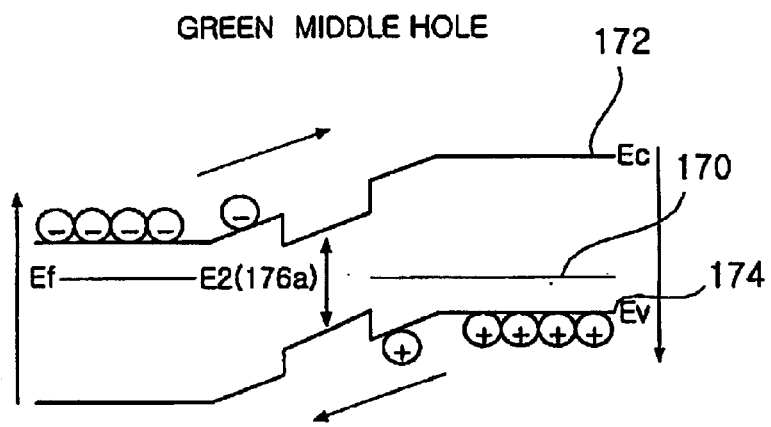

FIG. 17*b* shows an energy band gap between the electrons and holes when the quantum hole is formed to be the middle size. Light is emitted with an energy as large as E2 176*a* from the light emitting element which employs the middle size quantum holes, expressing a green color.

Figure 17C:
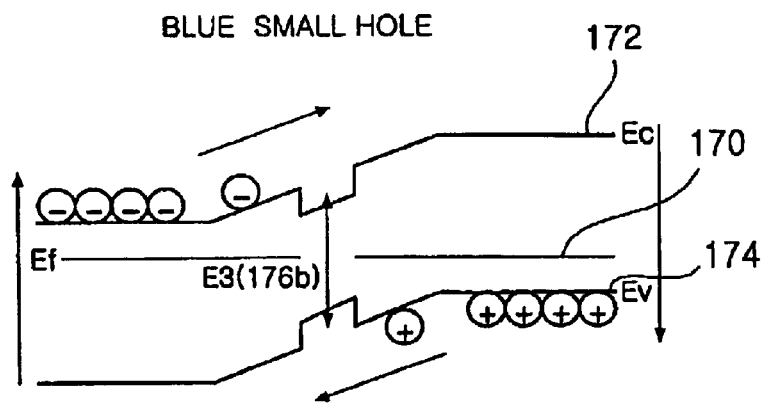

FIG. 17*c* shows an energy band gap between the electrons and holes when the quantum hole is formed to be the smallest size. Light is emitted with an energy as large as E3 176*b* from the light emitting element which employs the smallest quantum hole, expressing a blue color.

Therefore, a light-emitting device, which is able to provide radiation at wavelengths corresponding to red, green and blue colors, that is, at different energies, can be fabricated by controlling the size of the quantum holes in accordance with another embodiment of the present invention.

Figure 18:
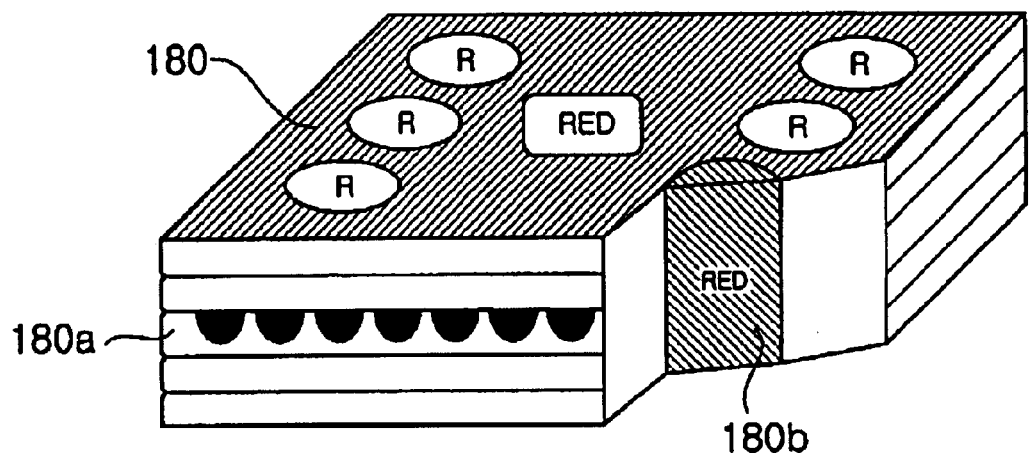
FIG. 18 shows views explaining the control of the light brightness of light-emitting devices according to colors.
Figure 18:
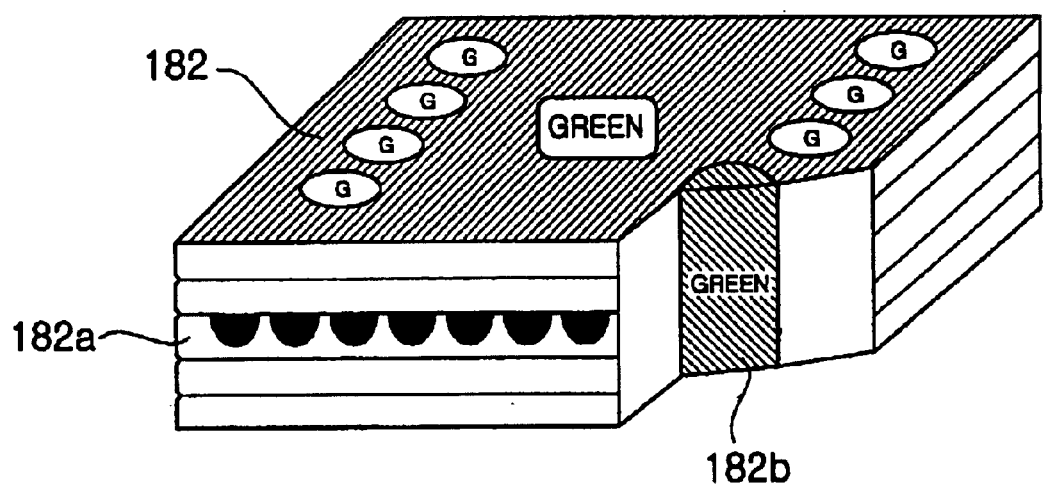
Figure 18:
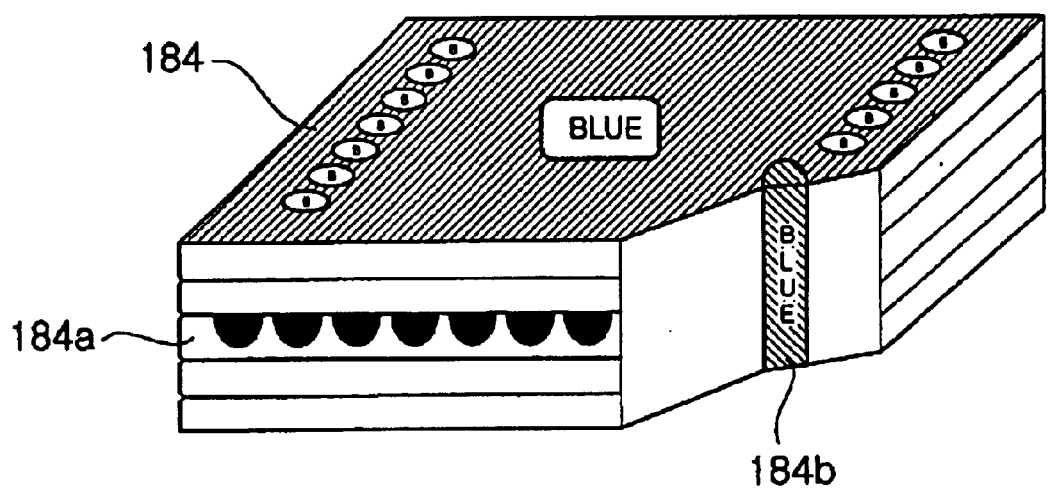

With reference to FIG. 18, views are provided for explaining the control of the light brightness, that is, light intensity of light-emitting devices according to colors. The light-emitting devices 180, 182 and 184, which emit red, green and blue light, respectively, are fabricated by growing materials different in energy band gap within quantum holes of quantum hole layers 180*a*, 182*a* and 184*a*. In this regard, the compositions of the crystalline materials differ from one quantum hole layer to another. Herein, the quantum holes formed in the quantum hole layers 180*a*, 182*a* and 184*a* are identical in size.

The light-emitting devices 180, 182 and 184 are cut into different sizes to control light brightness according to the color of the light emitted. For example, the light-emitting device 180, responsible for red light, is cut into unit light emitting elements 180*b* with a large size, the semiconductor device 182 responsible for green light into unit light emitting elements 182*b* with a medium size, and the semiconductor device 184 responsible for blue light into unit light emitting elements 184*b* with a small size. The unit light emitting elements 180*b*, 182*b* and 184*b* are different in size and thus in light intensity, that is, light brightness from one another. Therefore, the unit light emitting elements can be controlled in light brightness according to their sizes.

Figure 19:
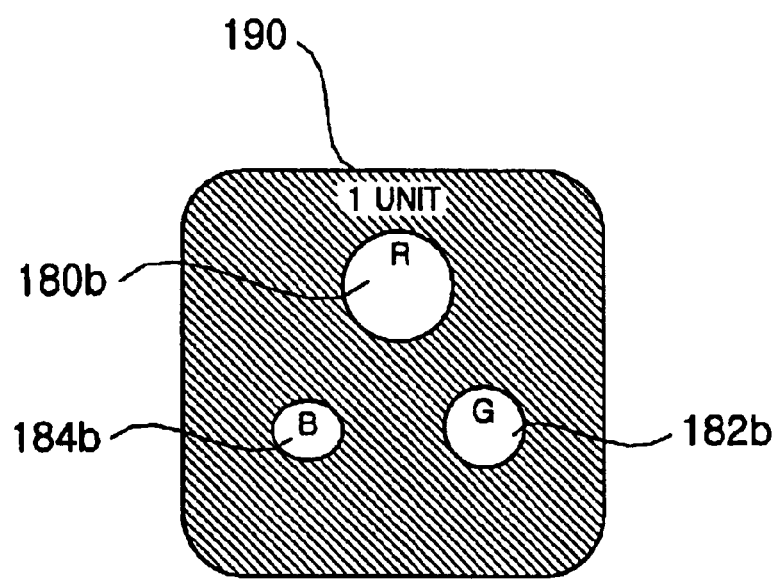
FIG. 19 is a schematic view showing a light emitting unit cut from the light-emitting devices of FIG. 18.

With reference to FIG. 19, there is seen a light emitting unit 190 cut from the light-emitting devices. As seen in FIG. 19, the light emitting unit 190 consists of three unit light emitting elements 180*b*, 182*b* and 184*b*, which are different in size from each other, but identical in quantum hole size. They are also different in the composition of the materials filled within their quantum holes from one another. Another difference is found in the energy band of the filling materials.

Figure 20:
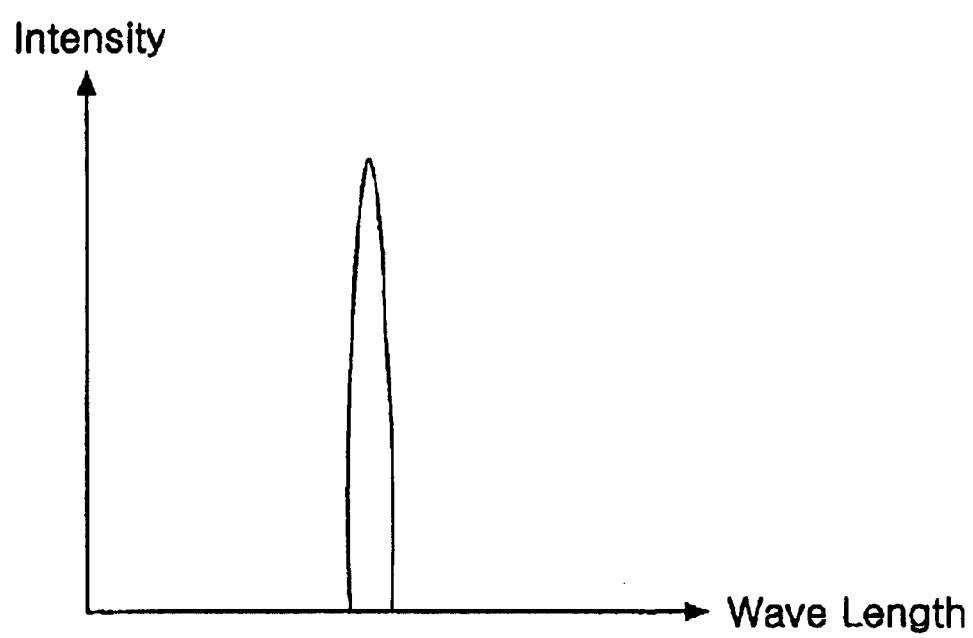
FIG. 20 is a curve showing the light intensity versus wavelength in the light emitting unit of FIG. 19.

FIG. 20 is a curve showing the light intensity versus wavelength in the light emitting unit 190 of FIG. 19. As apparent from the curve, wavelengths of the light emitted from the light-emitting unit of the present invention are distributed in a narrow range with the wavelength distribution curve having a sharp peak. Therefore, the light emitting unit 190 employing the light-emitting devices can emit radiation in a narrow range of wavelengths, thereby expressing desired colors clearly.

Figure 21:
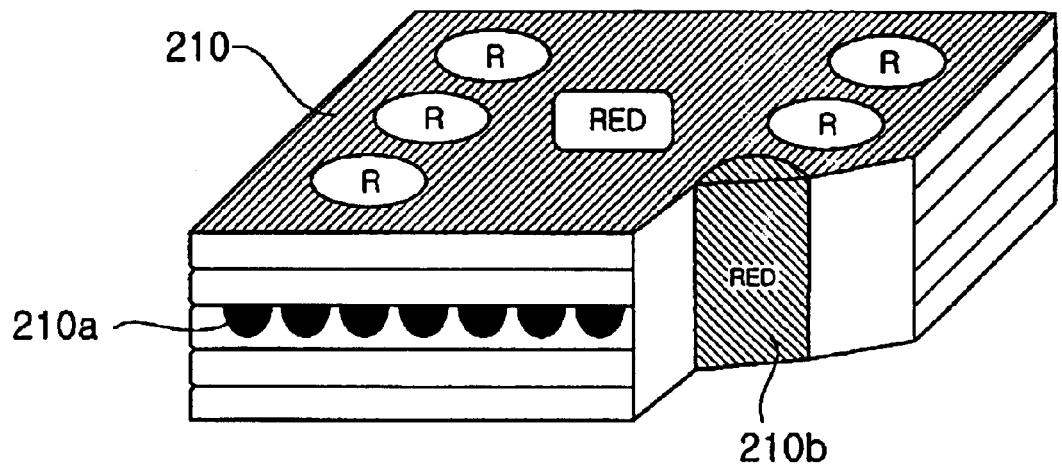
FIGS. 21 and 22 are views explaining the control of the light brightness, that is, light intensity of light-emitting devices according to colors.
Figure 21:
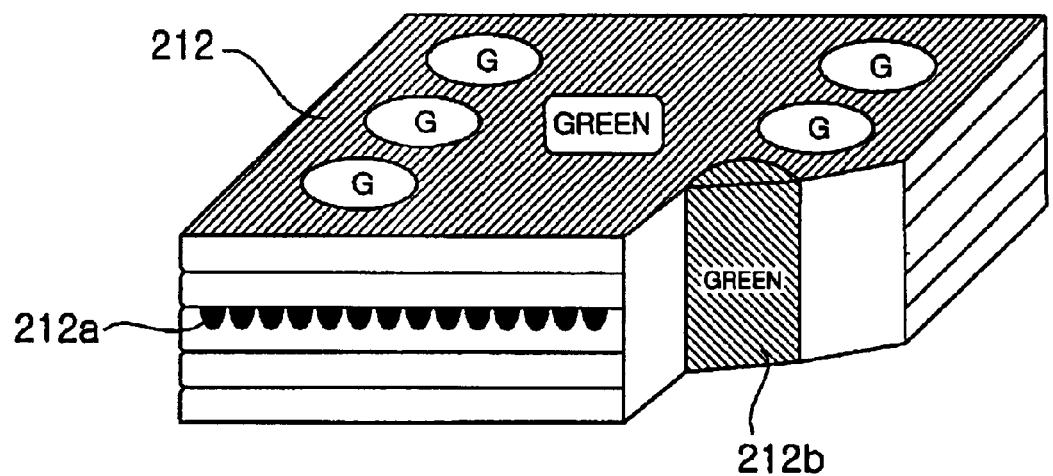
Figure 21:
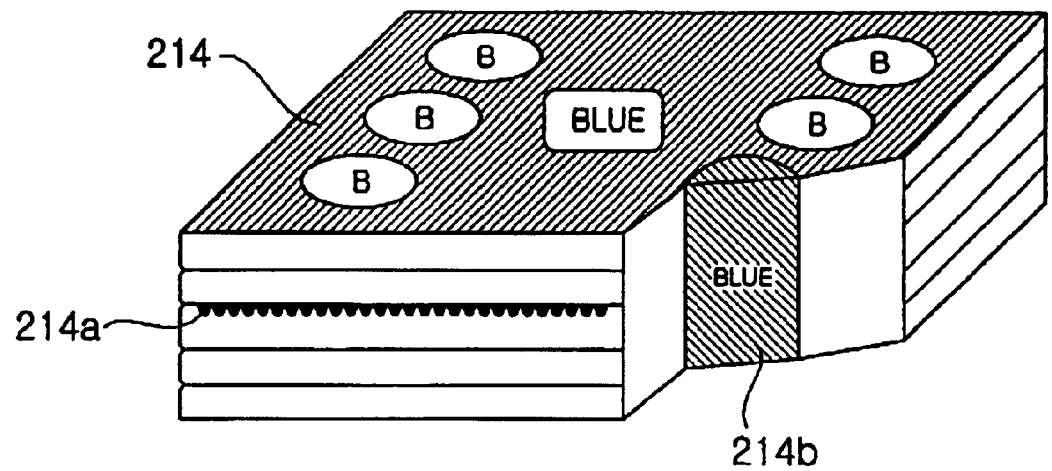
Figure 22:
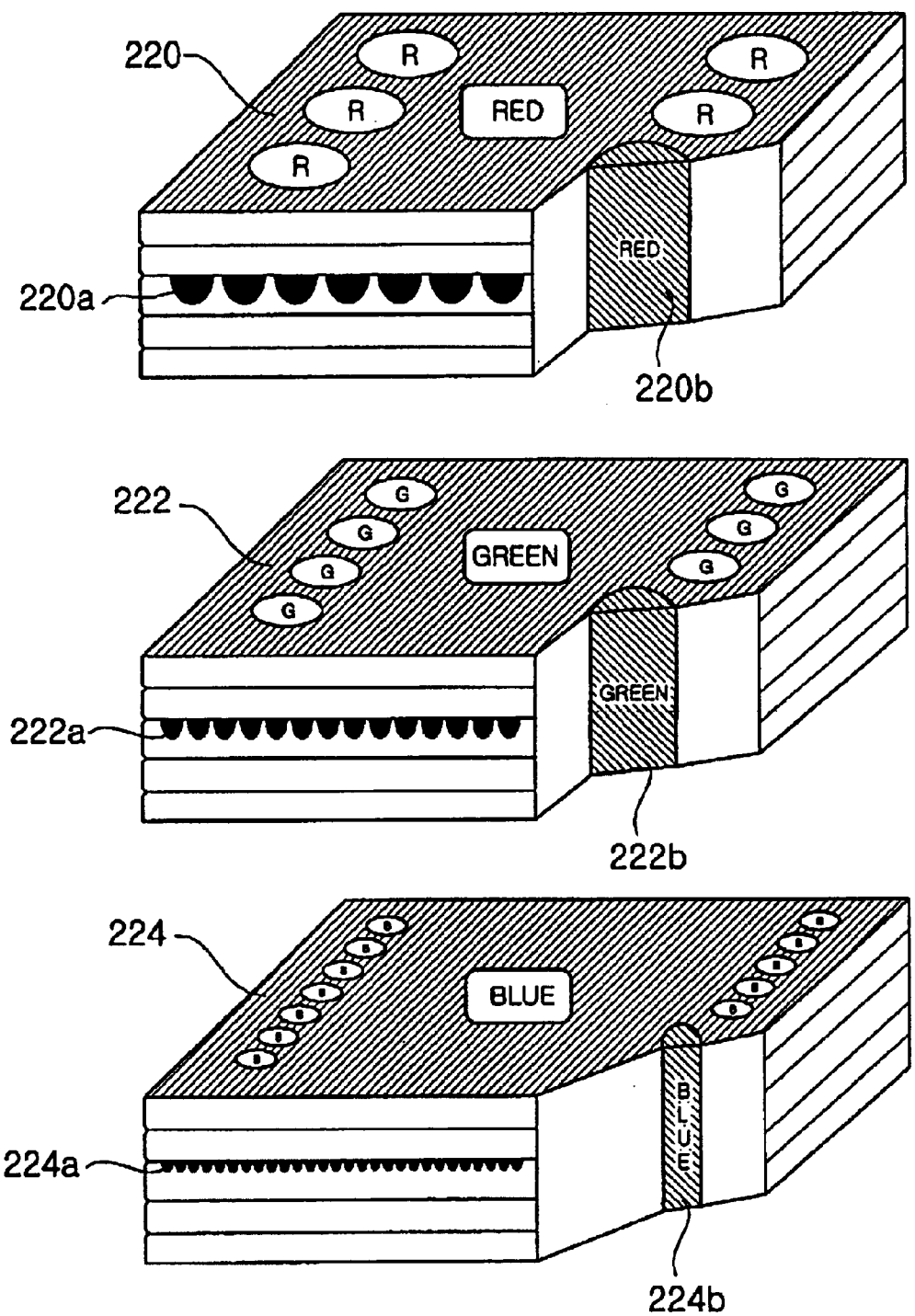

With reference to FIGS. 21 and 22, views are provided for explaining the control of the light brightness, that is, light intensity of light-emitting semiconductors devices, according to colors. In FIG. 21, the light-emitting devices 210, 212 and 214, which emit red, green and blue light, respectively, are fabricated by growing materials different in energy band gap within quantum holes of quantum hole layers 210a, 212a and 214a. In this regard, the composition of the crystalline materials is identical among the quantum hole layers. Herein, the quantum holes are different in size among the quantum hole layers 210a, 212a and 214a. The same as described for FIG. 21 is true of the three light-emitting devices 220, 222 and 224 of FIG. 22. That is, the filling materials are different in energy band gap, but identical in composition and the quantum holes differ in size from one quantum hole layer to another.

However, difference is found in the sizes of unit light emitting elements between the structures of FIGS. 21 and 22. In FIG. 21, the light-emitting devices 210, 212 and 214 are cut into unit light emitting elements 210b, 212b and 214b, which are identical in size. In contrast, the semiconductor devices 220, 222 and 224 are cut at different sizes to give unit light emitting elements 220b, 222b and 224b.

Consisting of the unit light emitting elements responsible for red, green and blue light, which are cut to be the same size or different sizes, a light emitting unit can control the light brightness. It is also possible to provide another characteristic by cutting the unit light emitting elements to different sizes.

As described hereinbefore, the light emitting devices of the present invention can express precise colors of light because their light emitting elements which use semiconductors emit radiation in a narrow range of wavelengths corresponding to red, green and blue light. In addition, unit light emitting elements of very small sizes can be fabricated in accordance with the present invention. Accordingly, displays can be manufactured to be small in size without loss of image definition and color purity.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A light-emitting device, comprising:

a P-type semiconductor layer for supplying holes;

a quantum hole layer with a plurality of quantum holes, formed on an intrinsic semiconductor layer which is grown to a certain thickness on said P-type semiconductor layer, said quantum holes being filled with a material smaller in energy band gap than said intrinsic semiconductor by single crystal growth for forming quantum dots, wherein said materials filled in said quantum holes shows an energy band gap corresponding to one of three primary colors of light, whereby said light-emitting device can emit light of the three primary colors; and an N-type semiconductor layer, formed on said quantum hole layer, for supplying electrons.

2. The light-emitting device as set forth in claim 1, wherein the diameters of said quantum holes range from 10 to 100 nm.

3. The light-emitting device as set forth in claim 1, wherein both of said P-type semiconductor layer and said N-type semiconductor layer are doped with GaN and said material filled in said quantum holes is InGaN.

4. The light-emitting device as set forth in claim 1, wherein both of said P-type semiconductor layer and said N-type semiconductor layer are doped with GaAs and said material filled in said quantum holes is InAs.

5. The light-emitting device as set forth in claim 1, wherein said quantum holes are formed at different sizes depending on the colors of the light to be emitted from the light-emitting device.

6. The light-emitting device as set forth in claim 1, wherein said quantum holes are formed at the same size irrespective of the colors of the light to be emitted from the light-emitting device.

7. The light-emitting device as set forth in claim 1, wherein said quantum holes are formed by an incidence of a focused ion beam on said intrinsic semiconductor layer.

8. The light-emitting device as set forth in claim 1, wherein said quantum holes are formed by:

projecting ions at high speeds from an ion gun;

focusing said ions to give an ion beam;

accelerating said ion beam at a suitable voltage;

making said focused ion beam incident on a plurality of spots, which quantum hole would be formed on, of a semiconductor substrate in front of a scanner to impact the surface of said semiconductor substrate while deflecting said ion beam up and down, right and left by use of deflecting means, said impact being controlled by acceleration voltage in such a way that said ions are not implanted into said semiconductor substrate, but physically destroy only the atomic structure on the surface of said semiconductor substrate; and controlling said ion beam according to preset values for the incidence time period and diameter of said ion beam to thereby adjust the size of the quantum holes.

9. The light-emitting device as set forth in claim 8, wherein said ion beam has a diameter of 100 nm and is incident on an area of 1 mm×1 mm in an amount of 1×1016 CM-2 at an acceleration voltage of 25–35 kV for 5 seconds or shorter.

10. The light-emitting device as set forth in claim 8, wherein the sizes of said quantum holes are controlled by the diameter and/or incidence time period of the ion beam.

11. The light-emitting device as set forth in claim 8, wherein the depths of said quantum holes are controlled by the acceleration voltage of said ion beam.

12. The light-emitting device as set forth in claim 1, wherein said quantum holes are thermally annealed quantum holes.

* * * * *